(12) United States Patent
Yamada

(10) Patent No.: US 8,825,440 B2
(45) Date of Patent: Sep. 2, 2014

(54) RESOLVER SIGNAL CONVERTER AND RESOLVER SIGNAL CONVERSION METHOD

(75) Inventor: Masahiro Yamada, Kobe (JP)

(73) Assignee: Kawasaki Jukogyo Kabushiki Kaisha, Kobe-shi (JP)

( * ) Notice: Subject to any disclaimer, the term of this patent is extended or adjusted under 35 U.S.C. 154(b) by 298 days.

(21) Appl. No.: 13/201,403

(22) PCT Filed: Dec. 27, 2010

(86) PCT No.: PCT/JP2010/007552
§ 371 (c)(1),
(2), (4) Date: Sep. 20, 2011

(87) PCT Pub. No.: WO2011/083550
PCT Pub. Date: Jul. 14, 2011

(65) Prior Publication Data
US 2012/0010849 A1    Jan. 12, 2012

(30) Foreign Application Priority Data
Jan. 7, 2010 (JP) ................................. 2010-002200

(51) Int. Cl.
*G01B 7/30*     (2006.01)
*G01D 5/20*     (2006.01)
*G08C 19/46*    (2006.01)

(52) U.S. Cl.
CPC .............. *G01D 5/2073* (2013.01); *G08C 19/46* (2013.01); *H03M 2201/843* (2013.01); *G05B 2219/37481* (2013.01)
USPC ........... 702/151; 702/163; 702/190; 318/606; 318/636; 318/661

(58) Field of Classification Search
CPC ................. G01D 5/2073; G05B 2219/37481; H03M 2201/843

USPC ........... 702/151, 163, 190; 318/605, 636, 661
See application file for complete search history.

(56) References Cited

U.S. PATENT DOCUMENTS 6,255,794 B1 *   7/2001   Staebler ......................... 318/605
7,514,896 B2 *   4/2009   Imura et al. .................... 318/718

(Continued)

FOREIGN PATENT DOCUMENTS

DE     102 19 678 C1    6/2003
EP     1 324 008 A1     7/2003

(Continued)

OTHER PUBLICATIONS

International Search Report issued in International Patent Application No. PCT/JP2010/007552 dated Apr. 5, 2011.

(Continued)

*Primary Examiner* — John Breene
*Assistant Examiner* — Timothy H Hwang
(74) *Attorney, Agent, or Firm* — Oliff PLC

(57) ABSTRACT

A resolver signal converter and a resolver signal conversion method amplify and perform analogue-digital conversion on a sine wave output from a resolver; thereafter, among frequency components of the sine wave output, pass and thereby extract a predetermined bandwidth of which the center frequency is the frequency of an excitation signal, by means of a band-pass filter; sample the sine wave output while synchronizing the sine wave output with a reference signal which is based on the excitation signal; and generate a detection angle signal sine value from the sampled signal. Similarly, a detection angle signal cosine value is generated from a cosine wave output from the resolver. A detection angle is calculated based on the detection angle signal sine value and the detection angle signal cosine value. Accordingly, an influence, on an input resolver signal, of disturbance noise such as noise caused due to a magnetic field generated by a motor and switching noise caused due to PWM driving, is eliminated, and frequency dependence of arithmetic processing is eliminated. As a result, detection angle errors are reduced.

7 Claims, 5 Drawing Sheets

(56) References Cited

U.S. PATENT DOCUMENTS

| | | | |
|---|---|---|---|
| 2003/0151383 A1* | 8/2003 | Hayashi | 318/661 |
| 2003/0206007 A1 | 11/2003 | Gass et al. | |
| 2007/0029955 A1* | 2/2007 | Kanekawa et al. | 318/144 |
| 2007/0219733 A1 | 9/2007 | Kawaguchi | |
| 2009/0160687 A1 | 6/2009 | Nakazato et al. | |

FOREIGN PATENT DOCUMENTS

| | | |
|---|---|---|
| JP | A-63-050717 | 3/1988 |
| JP | A 6-331386 | 12/1994 |
| JP | 09072758 A * | 3/1997 |
| JP | A-2003-153496 | 5/2003 |
| JP | A-2006-177750 | 7/2006 |
| JP | A-2007-248246 | 9/2007 |
| JP | A-2009-150826 | 7/2009 |

OTHER PUBLICATIONS

Jun. 25, 2014 Supplementary Search Report issued in European Patent Application No. 10842070.4.

* cited by examiner

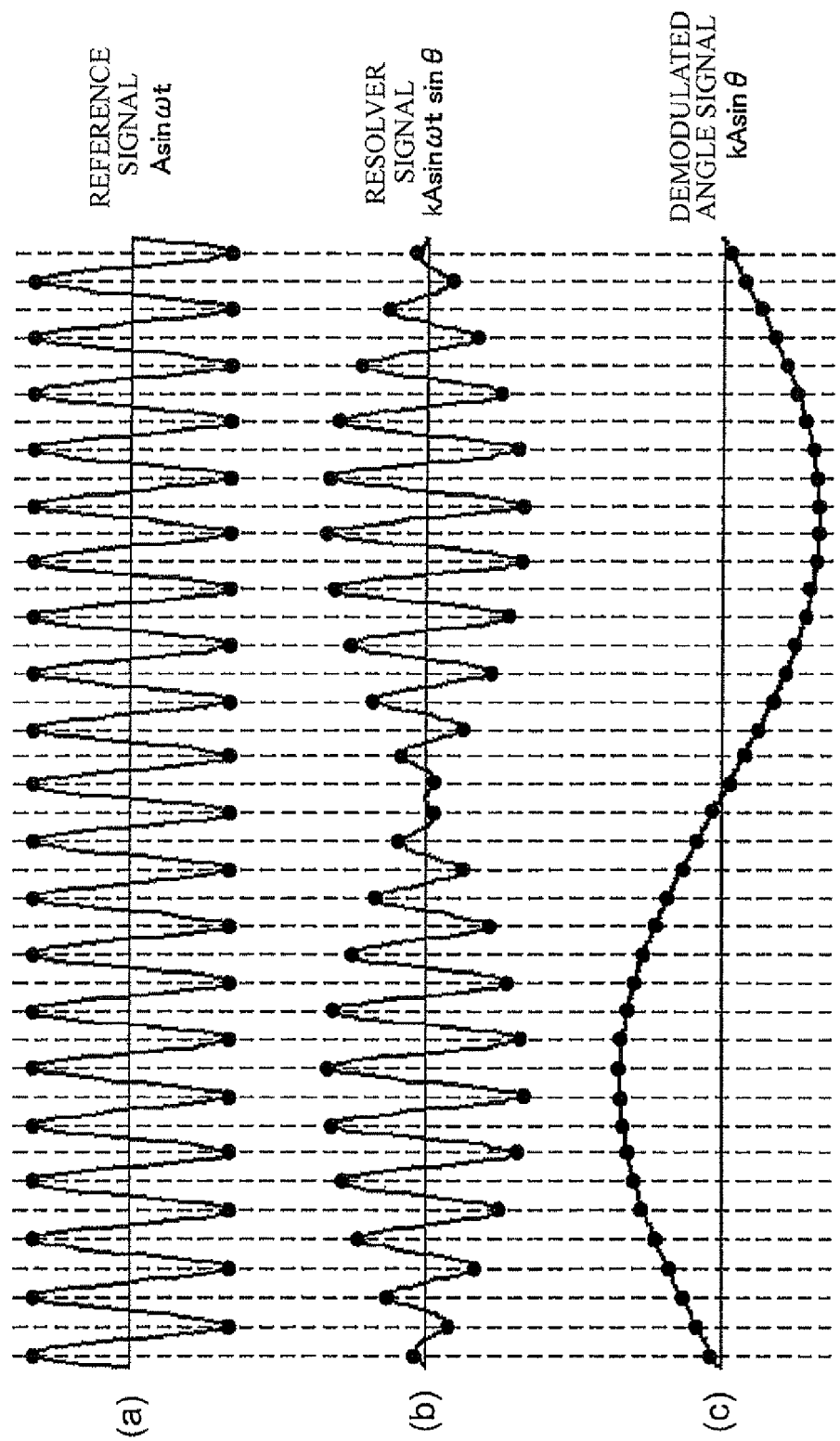

RESOLVER SIGNAL CONVERTER AND RESOLVER SIGNAL CONVERSION METHOD

TECHNICAL FIELD

The present invention relates to a resolver signal converter and a resolver signal conversion method for converting detection angles of two-phase resolver signals outputted from a resolver which is configured to detect a rotation angle of a motor or the like, into a digital output angle.

BACKGROUND ART

Conventionally, resolvers are used for detecting a rotation angle of a motor or the like. Such a resolver includes an excitation coil and detection coils. When an alternate current is supplied to the excitation coil, an AC voltage is generated at each detection coil in accordance with a relative angle between a stator and a rotor. These AC voltages are detected by voltmeters which are connected to the respective detection coils, and are then outputted to a resolver-digital converter (RD converter). The RD converter converts detection angles contained in respective resolver signals inputted thereto, into digital angle data, and outputs the digital angle data. In this manner, the resolver is used in combination with the RD converter.

Usually, a resolver is placed near a motor. Therefore, the resolver is significantly affected by a magnetic field generated by the motor, and noise that is caused by an influence of the magnetic field generated by the motor is superimposed on a resolver signal. While the motor is rotating, the magnetic field generated by the motor synchronizes with the rotation. Accordingly, the noise, which is superimposed on the resolver signal due to the magnetic field generated by the motor, is low frequency noise. In recent years, motors are often driven by PWM (Pulse Width Modulation) controlled voltage. A resolver included in such a PWM-driven motor is affected by switching noise. There are cases where such switching noise is distributed not only in a low-frequency region but also in a high-frequency region. If such disturbance noise is superimposed on a resolver signal that is inputted to the RD converter, then the operation of the RD converter is affected by the noise. Accordingly, digital angle outputs from the RD converter contain angle errors caused by the disturbance noise.

In this respect, Patent Literature 1 proposes an RD converter capable of removing noise that is caused by an influence of a magnetic field generated by a motor. The RD converter includes: a synchronous detection circuit configured to perform synchronous detection in an angle calculation loop by referring to an excitation signal; a controller configured to control a digital angle output such that an output from the synchronous detection circuit becomes zero; and a band-stop filter, disposed between the synchronous detection circuit and the controller, configured to remove low-frequency noise components superimposed on a resolver signal. Here, a bandwidth of 2 kHz or higher, having an excitation frequency of 10 kHz as a center frequency, is set for the band-stop filter, and the band-stop filter is configured to remove frequencies within this bandwidth.

CITATION LIST

Patent Literature

PTL 1: Japanese Laid-Open Patent Application Publication No. 2009-150826

SUMMARY OF INVENTION

Technical Problem

General RD converters, including the RD converter disclosed in Patent Literature 1, employ a tracking loop which operates to feed back an output angle in response to an input angle, such that the deviation between the input angle and the output angle is always zero. However, these RD converters including a tracking loop have such frequency characteristics that the gain increases at a particular frequency. Therefore, there is a case where a discrepancy occurs between an actual angle and an output angle, depending on a frequency.

In view of the above, an object of the present invention is to provide a resolver signal converter and a resolver signal conversion method, which eliminate frequency dependence of arithmetic processing and which reduce an influence, on an input resolver signal, of disturbance noise caused due to, for example, a magnetic field generated by a motor, thereby reducing detection angle errors of a resolver.

Solution to Problem

A resolver signal converter according to the present invention includes: a first band-pass filter designed to pass, among frequency components of a first resolver signal which is a sine wave output from a resolver, a predetermined bandwidth of which the center frequency is the frequency of an excitation signal; a first sampling synchronous rectifier configured to sample the first resolver signal which has passed through the first band-pass filter, while synchronizing the first resolver signal with a reference signal which is based on the excitation signal, and to generate a detection angle signal sine value from the sampled first resolver signal; a second band-pass filter designed to pass, among frequency components of a second resolver signal which is a cosine wave output from the resolver, a predetermined bandwidth of which the center frequency is the frequency of the excitation signal; a second sampling synchronous rectifier configured to sample the second resolver signal which has passed through the second band-pass filter, while synchronizing the second resolver signal with the reference signal, and to generate a detection angle signal cosine value from the sampled second resolver signal; and an angle calculator configured to calculate a detection angle from the detection angle signal sine value and the detection angle signal cosine value.

Similarly, a resolver signal conversion method according to the present invention includes: a step of filtering a first resolver signal which is a sine wave output from a resolver, by means of a first band-pass filter which is designed to pass, among frequency components of the first resolver signal, a predetermined bandwidth of which the center frequency is the frequency of an excitation signal; a first sampling synchronous rectifying step of sampling the first resolver signal which has passed through the first band-pass filter, while synchronizing the first resolver signal with a reference signal which is based on the excitation signal, and generating a detection angle signal sine value from the sampled first resolver signal; a step of filtering a second resolver signal which is a cosine wave output from the resolver, by means of a second band-pass filter which is designed to pass, among frequency components of the second resolver signal, a predetermined bandwidth of which the center frequency is the frequency of the excitation signal; a second sampling synchronous rectifying step of sampling the second resolver signal which has passed through the second band-pass filter, while synchronizing the second resolver signal with the reference signal, and generating a detection angle signal cosine value from the sampled second resolver signal; and a step of calculating a detection angle from the detection angle signal sine value and the detection angle signal cosine value.

According to the above resolver signal converter and resolver signal conversion method, since each resolver signal is filtered with the respective first or second band-pass filter, it is no longer necessary to correct an offset error that occurs when the resolver signal passes through an analogue signal processing section. This makes it possible to reduce detection angle errors. Filtering each resolver signal with the respective first or second band-pass filter also makes it possible to attenuate disturbance noise frequency components from the resolver signal. Furthermore, since the resolver signal is not multiplied by the reference signal in the synchronous rectification, a harmonic of the reference signal or disturbance noise is not amplified. Accordingly, influences of these factors on a detection angle signal are reduced. Since no tracking loop is involved in resolver signal processing, there is no frequency dependence. Thus, according to the resolver signal converter and the resolver signal conversion method, detection angle errors of the resolver can be reduced.

In the resolver signal converter, preferably, each of the first and second sampling synchronous rectifiers is configured to: sample the respective first or second resolver signal at a timing when the positive amplitude of the reference signal becomes maximum and at a timing when the negative amplitude of the reference signal becomes maximum; either store the sampled resolver signal as it is in a case where the resolver signal is sampled at a timing when the positive amplitude of the reference signal becomes maximum, and store the sampled resolver signal after inverting the sign of the resolver signal from minus to plus in a case where the resolver signal is sampled at a timing when the negative amplitude of the reference signal becomes maximum, or store the sampled resolver signal as it is in a case where the resolver signal is sampled at a timing when the negative amplitude of the reference signal becomes maximum, and store the sampled resolver signal after inverting the sign of the resolver signal from plus to minus in a case where the resolver signal is sampled at a timing when the positive amplitude of the reference signal becomes maximum; and arrange the stored resolver signals in chronological order to generate the respective detection angle signal sine value and detection angle signal cosine value.

Similarly, in one embodiment of the resolver signal conversion method,
each of the first and second sampling synchronous rectifying steps includes the steps of:
sampling the respective first or second resolver signal at a timing when the positive amplitude of the reference signal becomes maximum and at a timing when the negative amplitude of the reference signal becomes maximum;
either storing the sampled resolver signal as it is in a case where the resolver signal is sampled at the timing when the positive amplitude of the reference signal becomes maximum, and storing the sampled resolver Signal after inverting the sign of the resolver signal from minus to plus in a case where the resolver signal is sampled at the timing when the negative amplitude of the reference signal becomes maximum, or storing the sampled resolver signal as it is in a case where the resolver signal is sampled at the timing when the negative amplitude of the reference signal becomes maximum, and storing the sampled resolver signal after inverting the sign of the resolver signal from plus to minus in a case where the resolver signal is sampled at the timing when the positive amplitude of the reference signal becomes maximum; and
arranging the stored resolver signals in chronological order to generate the respective detection angle signal sine value and detection angle signal cosine value.

According to the above, the resolver signal sampling can be performed at a sampling rate that is a half of the period of the reference signal. By using the sampling rate that is a half of the period of the reference signal, a response speed (data updating cycle) can be increased.

Preferably, the resolver signal converter further includes a phase corrector configured to correct the excitation signal by an amount that corresponds to an estimated phase lag, and to supply a resultant signal as the reference signal. According to this configuration, the phase of the supplied reference signal is corrected by an amount that corresponds to the following phase lags: a phase lag that occurs during a period until a current based on the excitation signal is supplied to the resolver; and a phase lag that occurs during a period from when each resolver signal is inputted to the resolver signal converter to when the resolver signal reaches the respective sampling synchronous rectifier. This improves detection accuracy.

Preferably, the resolver signal converter further includes a difference calculator configured to calculate a rotational speed based on a difference between samples of the detection angle; and a phase lag corrector configured to calculate, based on the detection angle and the rotational speed, a corrected detection angle of which a phase lag has been corrected, the phase lag arising due to each of the first and second resolver signals passing through the respective first or second band-pass filter.

Similarly, it is preferred that the resolver signal conversion method further includes the steps of calculating a rotational speed based on a difference between samples of the detection angle; and calculating, based on the rotational speed and the detection angle, a corrected detection angle of which a phase lag has been corrected, the phase lag arising due to each of the first and second resolver signals passing through the respective first or second band-pass filter.

According to the above, the phase lag arising due to each of the first and second resolver signals passing through the respective first or second band-pass filter is corrected, and thereby detection angle errors can be further reduced.

Preferably, the resolver signal converter further includes: amplifiers, each of which is configured to amplify the respective first or second resolver signal prior to input into the corresponding first or second band-pass filter; and AD converters, each of which is configured to convert the amplified respective first or second resolver signal from an analogue signal into a digital signal and to output the digital signal to the corresponding first or second band-pass filter.

Preferably, in the resolver signal converter, at least the first and second band-pass filters, the first and second sampling synchronous rectifiers, and the angle calculator are formed on a single programmable device. According to this configuration, since arithmetic operations performed by the respective arithmetic sections are processed within the programmable device, arithmetic operations at a higher speed than arithmetic operations using software in a microcomputer or the like can be realized, and also, adjustments among these arithmetic sections can be readily performed. Still further, since the resolver signal converter is formed with a small number of components, the resolver signal converter is compact in size and contributes to cost reduction.

Advantageous Effects of Invention

The present invention eliminates frequency dependence of arithmetic processing, and reduces an influence, on an input resolver signal, of disturbance noise such as noise caused due to a magnetic field generated by a motor and switching noise caused due to PWM driving. This makes it possible to reduce detection angle errors of a resolver.

BRIEF DESCRIPTION OF DRAWINGS

FIG. 5 illustrates a sampling synchronous rectification process which is performed on a resolver signal by using a reference signal, and shows the waveform of the reference signal, the waveform of the resolver signal, and the waveform of a demodulated detection angle signal.

DESCRIPTION OF EMBODIMENTS

Figure 1:
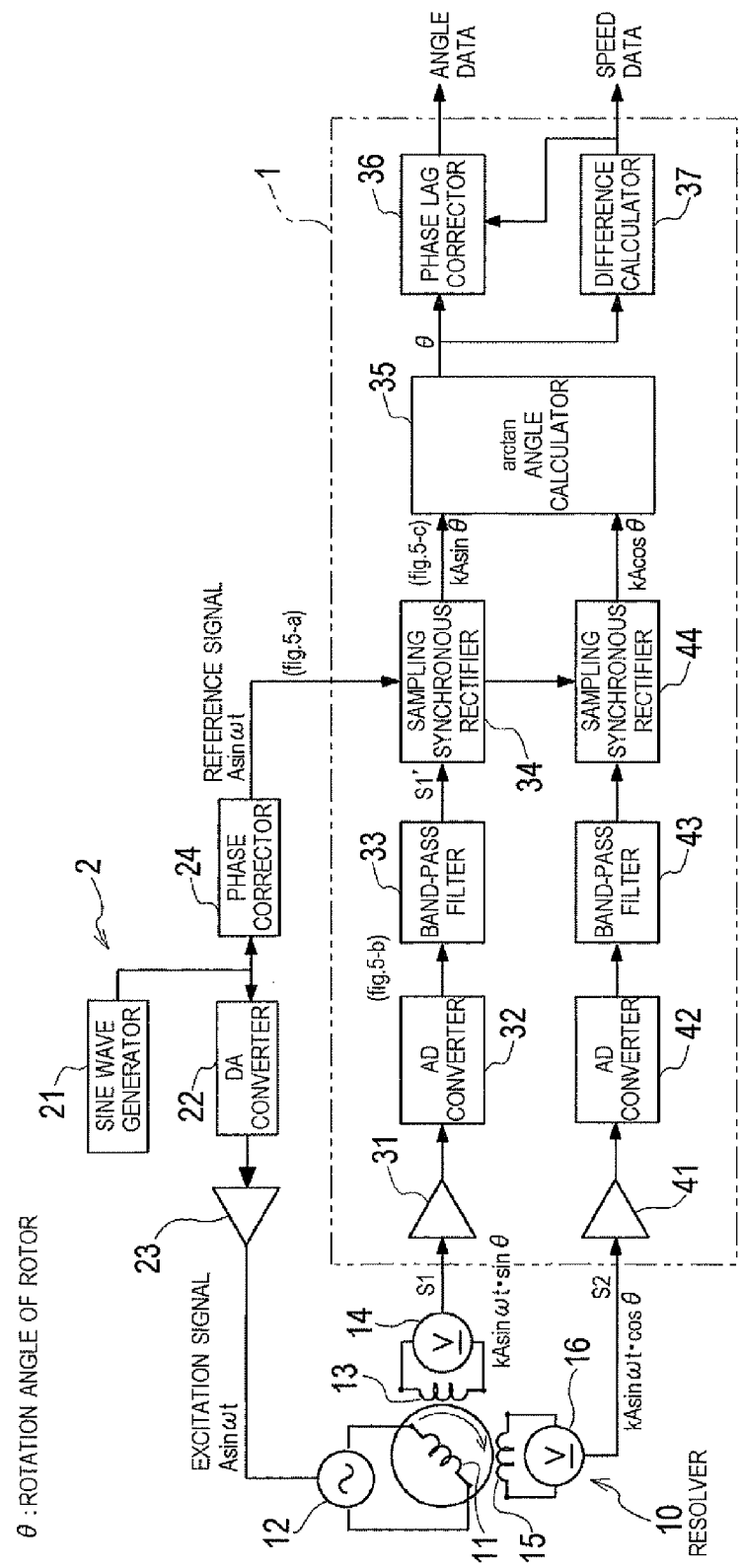
FIG. 1 is a block diagram showing a configuration of an angle detection device including an RD converter which is a resolver signal converter according to the present invention.

Hereinafter, an embodiment of the present invention is described in detail with reference to the accompanying drawings. A resolver signal converter according to the embodiment of the present invention is configured as a resolver-digital converter (hereinafter, referred to as an "RD converter 1"). FIG. 1 shows a configuration of the RD converter 1, and shows the RD converter 1, a resolver 10, and an excitation signal generator 2, collectively as an angle detection device.

The resolver 10 is disposed near the winding of a motor (not shown). The resolver 10 includes: an excitation coil 11 provided at the rotor of the motor; and a first detection coil 13 and a second detection coil 15 which are provided at the stator of the motor. The excitation coil 11 is supplied with an AC voltage from an AC power supply 12, which AC voltage is based on an excitation signal generated by the excitation signal generator 2. The first detection coil 13 and the second detection coil 15 are positioned around the rotor, such that their phases are shifted from each other by 90° with respect to the axial center of the rotor in terms of an electrical angle. These coils 13 and 15 are connected to voltmeters 14 and 16, respectively. Each of the voltmeters 14 and 16 is configured to detect a voltage at both ends of the corresponding one of the coils 13 and 15, and to output the detected voltage to the RD converter 1.

The excitation signal generator 2 includes a sine wave generator 21, a DA converter (Digital-Analogue converter) 22, an amplifier 23, and a phase corrector 24. The sine wave generator 21 generates a sinusoidal excitation signal A sin ωt. The excitation signal is inputted to the DA converter 22 where the inputted signal is converted from a digital signal into an analogue signal. The analogue signal is inputted to the amplifier 23 where the inputted signal is amplified, and then the amplified signal is inputted to the AC power supply 12 of the resolver 10.

When the excitation signal A sin ωt is inputted to the AC power supply 12, the AC power supply 12 supplies the excitation coil 11 with an excitation voltage that is based on the excitation signal. It should be noted that the excitation voltage may be directly supplied to the excitation coil 11 from the amplifier 23 without involving the AC power supply 12. When the excitation voltage is supplied to the excitation coil 11, a voltage that results from modulating the excitation voltage with a rotation angle of the rotor (i.e., a detection angle θ) is generated at each of the detection coils 13 and 15. In response, the voltmeter 14 connected to the first detection coil 13 outputs a first resolver signal S1 as a corresponding detection signal, and the voltmeter 16 connected to the second detection coil 15 outputs a second resolver signal S2 as a corresponding detection signal. It should be noted that these resolver signals may be inputted to the RD converter 1 directly from the coils 13 and 15 without involving the voltmeters 14 and 16.

The first resolver signal S1 depends on a sine wave sine of the detection angle θ, and is represented by S1=kAsinωt·sin θ. Here, k represents a transformation ratio. The second resolver signal S2 depends on a cosine wave cos θ of the detection angle θ, and is represented by S2=kA sin ωt·cos θ. In this manner, two-phase resolver signals, of which the respective amplitudes sinusoidally vary with respect to the detection angle θ and of which the respective phases are shifted from each other by 90°, are inputted from the resolver 10 to the RD converter 1. These resolver signals are converted by the RD converter 1 into angle data, which is outputted as a digital signal. The excitation signal generator 2, the resolver 10, and the RD converter 1, which are combined as described above, can act as a digital angle detection device.

(Configuration of RD Converter 1)

Figure 2:
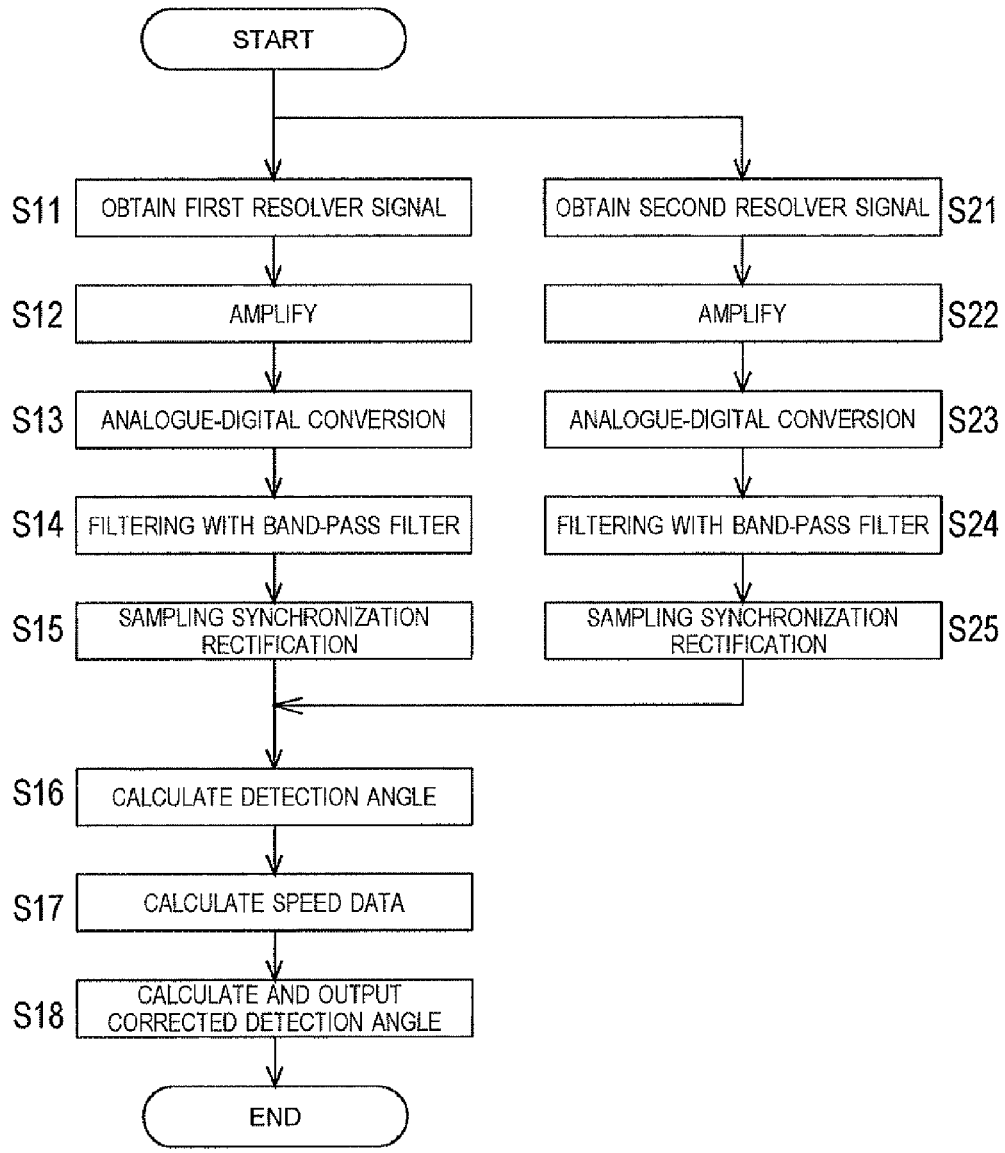
FIG. 2 is a flowchart showing a flow of a resolver signal conversion process.

Next, a configuration of the RD converter 1 is described in detail. The RD converter 1 includes: a first amplifier 31; a second amplifier 41; a first AD converter (Analogue-Digital converter) 32; a second AD converter (Analogue-Digital converter) 42; a first band-pass filter 33; a second band-pass filter 43; a first sampling synchronous rectifier 34; a second sampling synchronous rectifier 44; an angle calculator 35; a phase lag corrector 36; and a difference calculator 37. Hereinafter, each component of the RD converter 1 is described in relation to a flow of a resolver signal conversion process shown in FIG. 2.

The first resolver signal S1, which is inputted to the RD converter 1 from the resolver 10 (step S11), is amplified by the first amplifier 31 (step S12). Then, the amplified signal, which is an analogue signal, is converted by the first AD converter 32 into a digital signal (step S13), and filtered by the first band-pass filter 33 (step S14). The filtered signal is rectified by the first sampling synchronous rectifier 34 in synchronization with a reference signal which is based on the excitation signal (step S15). The demodulated signal (i.e., the signal subjected to the synchronous rectification), which is a detection angle signal, is inputted to the angle calculator 35 as a sine wave sin θ. The second resolver signal S2, which is inputted to the RD converter 1 from the resolver 10 (step S21), is amplified by the second amplifier 41 (step S22). Then, the amplified signal, which is an analogue signal, is converted by the second AD converter 42 into a digital signal (step S23), and filtered by the second band-pass filter 43 (step S24). The filtered signal is rectified by the second sampling synchronous rectifier 44 in synchronization with the reference signal (step S25). The demodulated signal (i.e., the signal subjected to the synchronous rectification), which is a detection angle signal, is inputted to the angle calculator 35 as a cosine wave cos θ.

The first band-pass filter 33 is configured to attenuate frequencies, outside a set passband, of the resolver signal that has been subjected to the analogue-digital conversion at the first AD converter 32, and to only pass the passband frequencies of the resolver signal. The resolver signal inputted to the first band-pass filter 33 contains an offset error that occurs when the resolver signal passes through an analogue signal processing section, that is, the first amplifier 31 and the first AD converter 32. One of the purposes of providing the first band-pass filter 33 is to eliminate problems arising from the offset error. Since the RD converter 1 includes the first band-pass filter 33, the RD converter 1 does not perform such a correction process as subtracting an offset amount from a detected resolver signal.

Figure 3:
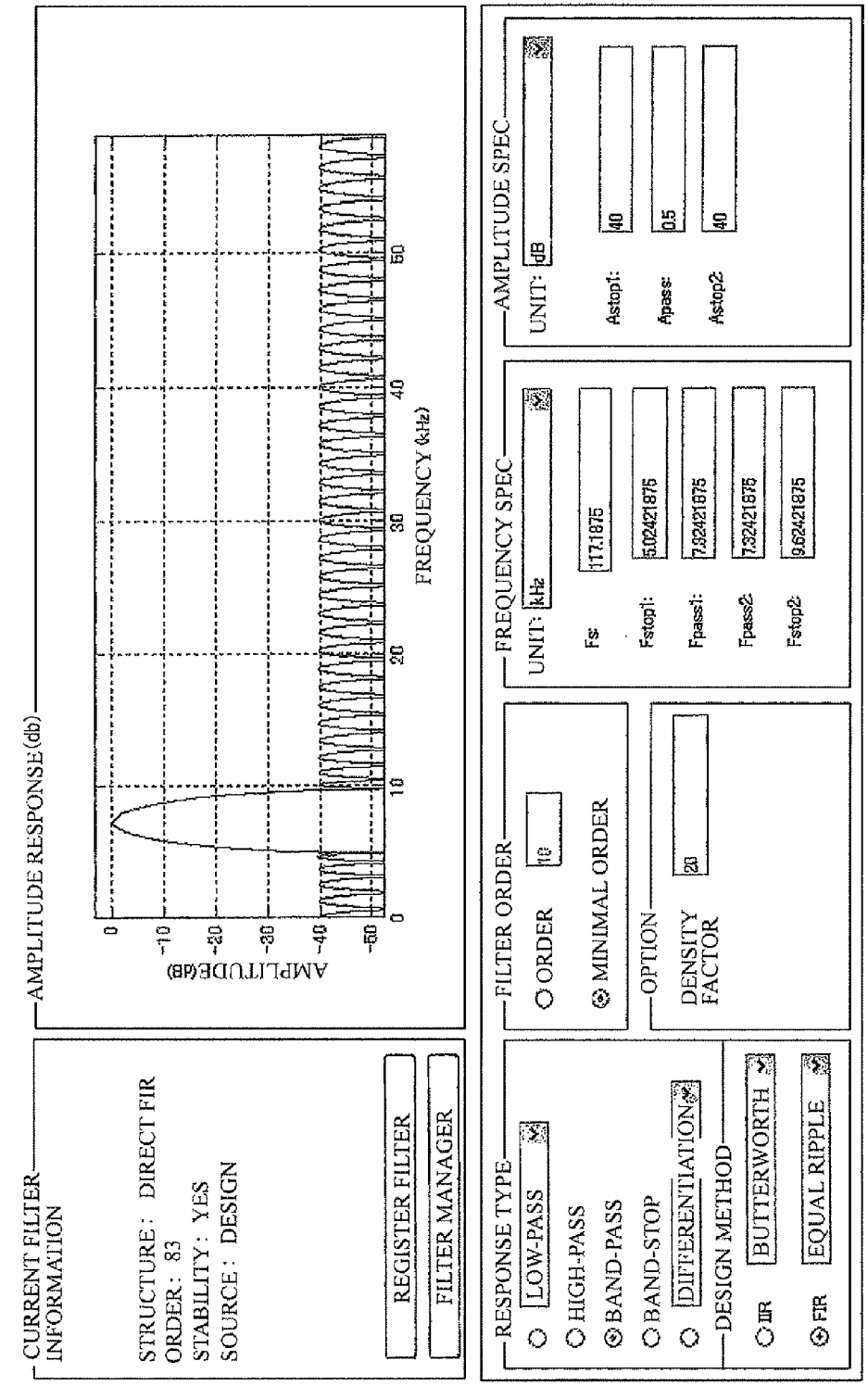
FIG. 3 shows a band-pass filter design example.
Figure 4A:
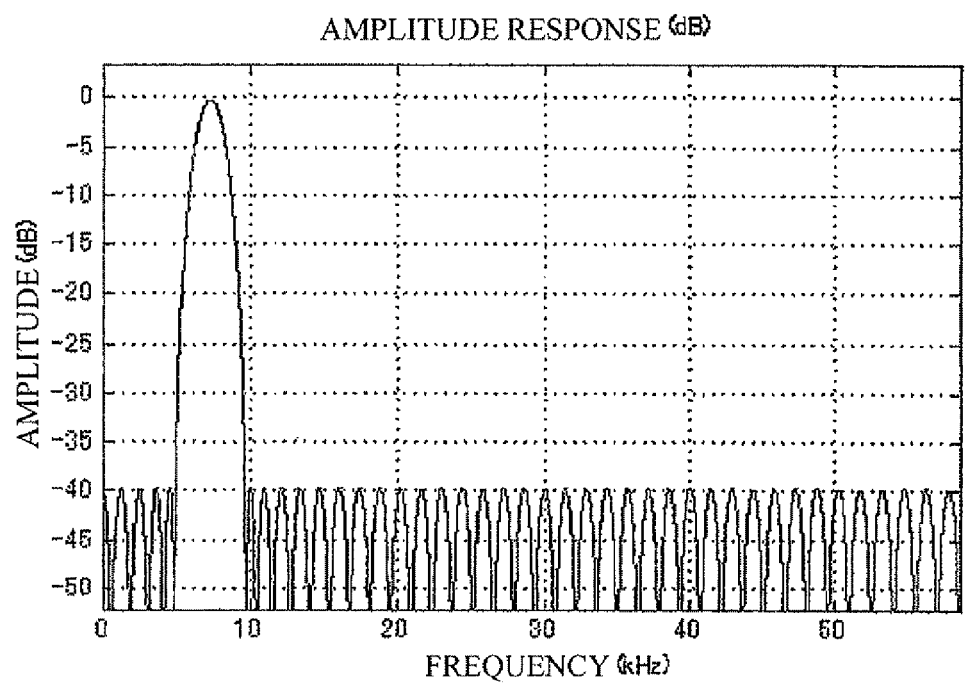
FIG. 4A shows, in relation to the band-pass filter design example, a graph that shows amplitude response characteristics of a first band-pass filter.

The center frequency of the passband of the first band-pass filter 33 is the frequency of the excitation signal. The width of the passband is determined based on: frequency characteristics necessary for angle detection; the frequency of noise to be reduced; and the amount of attenuation of the frequency. That is, the first band-pass filter 33 has a function of extracting, from the resolver signal, only frequency components that are outputted as a result of the excitation signal being modulated by the resolver 10. For example, FIG. 3 shows an example of a displayed screen with which to input settings of the first hand-pass filter 33. The displayed screen in this example shows the following settings: the frequency of the excitation signal is 7.3 kHz; the frequency of noise is 10 kHz; the width of the passband is ±2.3 kHz; and the passband is 5.0 to 9.6 kHz. Also, the order of an FIR (Finite Impulse Response) filter is set to 83 in order to obtain, outside the passband, an attenuation amount of 40 decibels or greater. FIG. 4A is a graph showing amplitude response characteristics of the first band-pass filter 33. In FIG. 4A, the vertical axis represents amplitude and the horizontal axis represents frequency. As shown in FIG. 4A, the first band-pass filter 33, the settings of which are as above, attenuates frequencies outside a passband of 5.0 to 9.6 kHz by an attenuation amount of 40 decibels or greater.

Since the first band-pass filter 33 passes frequency components of the resolver signal that are within the passband, a resultant resolver signal S1' which has passed through the first band-pass filter 33 contains frequency components that are outputted as a result of the excitation signal being modulated at the resolver 10, but does not contain zero and near-zero frequency components (i.e., DC components). Accordingly, it is not necessary to take an offset error into account regarding the resolver signal S1' which has passed through the first band-pass filter 33. Moreover, in the resolver signal S1' having passed through the first band-pass filter 33, noise components outside the passband are removed through the attenuation.

It should be noted that the filtering needs to be performed with the same filtering characteristics for both the channel of the first resolver signal S1 and the channel of the second resolver signal S2, in order to obtain detection angle accuracy. Therefore, it is necessary to eliminate discrepancies between the filter characteristics of the first band-pass filter 33 and the filter characteristics of the second band-pass filter 43, and to achieve completely uniform filter characteristics for both the channels. In order to achieve this, the first band-pass filter 33 and the second hand-pass filter 43 are both configured as a digital filter, and the same passband is set for both the band-pass filters 33 and 43. Thus, the use of digital filters makes it possible to eliminate negative effects on the angle detection performance that are caused, in the case of using analogue filters, by discrepancies in filter component characteristics between the analogue filters.

The first sampling synchronous rectifier 34 is configured to sample the first resolver signal S1' which has passed through the first band-pass filter 33, while synchronizing the first resolver signal S1' with the reference signal which is based on the excitation signal supplied to the AC power supply 12 (i.e., supplied to the resolver 10). In this manner, the first resolver signal S1' is rectified, and the resultant signal is outputted to the angle calculator 35 as a demodulated detection angle signal. However, the excitation signal, which is generated by the sine wave generator 21 of the excitation signal generator 2 and which is supplied to the AC power supply 12, contains a phase lag that occurs when the excitation signal passes through the DA converter 22 and the amplifier 23. Therefore, this phase lag, and also a phase lag that occurs when the signal passes through the winding of the resolver 10, the first amplifier 31, the first AD converter 32, and the first band-pass filter 33, are estimated. Then, the phase of the excitation signal is delayed by the phase corrector 24 by an amount that corresponds to these estimated phase lags, and the resultant signal is inputted to the first sampling synchronous rectifier 34 as the reference signal.

FIG. 5 illustrates the sampling and rectifying process performed on the first resolver signal S1' by the first sampling synchronous rectifier 34. A waveform (a) shown as the uppermost waveform in FIG. 5 is the waveform of the reference signal A sin ωt which is inputted to the first sampling synchronous rectifier 34 from the excitation signal generator 2. A waveform (b) shown in the middle of FIG. 5 is the waveform of the first resolver signal S1' which has been inputted to the RD converter 1 and which has passed through the first amplifier 31, the first AD converter 32, and the first band-pass filter 33. A waveform (c) shown as the lowermost waveform in FIG. 5 is the waveform of the demodulated detection angle signal. In FIG. 5, the vertical axis represents amplitude and the horizontal axis represents time. The first sampling synchronous rectifier 34 samples the first resolver signal S1' at a timing when the positive amplitude of the reference signal becomes maximum and at a timing when the negative amplitude of the reference signal becomes maximum. The first sampling synchronous rectifier 34 stores the sampled first resolver signal S1' as it is in a case where the first resolver signal S1' is sampled at a timing when the positive amplitude of the reference signal becomes maximum. On the other hand, the first sampling synchronous rectifier 34 stores the sampled first resolver signal S1' after multiplying the first resolver signal S1' by −1 to invert the sign of the first resolver signal S1' from minus to plus in a case where the first resolver signal S1' is sampled at a timing when the negative amplitude of the reference signal becomes maximum. These stored signals are arranged in chronological order, and thereby an angle detection signal is generated. By performing the sampling synchronous rectification in this manner, the first resolver signal S1' is sampled at a sampling rate that is a half of the period of the reference signal. It should be noted that since the frequency of the reference signal is a few kHz in general, the sampling rate is a little over 10 kHz. Signals sampled at this sampling rate are discontinuous, which, however, does not cause a problem, because it is often the case that a general calculation cycle of microcomputers for controlling a motor or the like is a few kHz or less when converted into a frequency. In the first sampling synchronous rectifier 34, the reference signal is used to determine the timing of the sampling, and the reference signal and the resolver signal are not multiplied together. Accordingly, disturbance noise is not amplified, which makes disturbance noise less likely to occur in the demodulated detection angle signal. Also, distortion due to a harmonic of the reference signal does not occur in the detection angle signal.

The configuration of the components from the first amplifier 31 to the first sampling synchronous rectifier 34 and the processes performed on the first resolver signal S1 by these components (i.e., steps S11 to S15), which have been described above, are the same as the configuration of the components from the second amplifier 41 to the second sampling synchronous rectifier 44 and the processes performed on the second resolver signal S2 by these components (i.e., steps S21 to S25). Therefore, detailed descriptions regarding the second amplifier 41, the second AD converter 42, the second band-pass filter 43, and the second sampling synchronous rectifier 44 are omitted. It should be noted that a sine value $kA \sin \theta$ of a demodulated detection angle signal is outputted from the first sampling synchronous rectifier 34 to the angle calculator 35, and that a cosine value $kA \cos \theta$ of a demodulated detection angle signal is outputted from the second sampling synchronous rectifier 44 to the angle calculator 35.

Figure 4B:
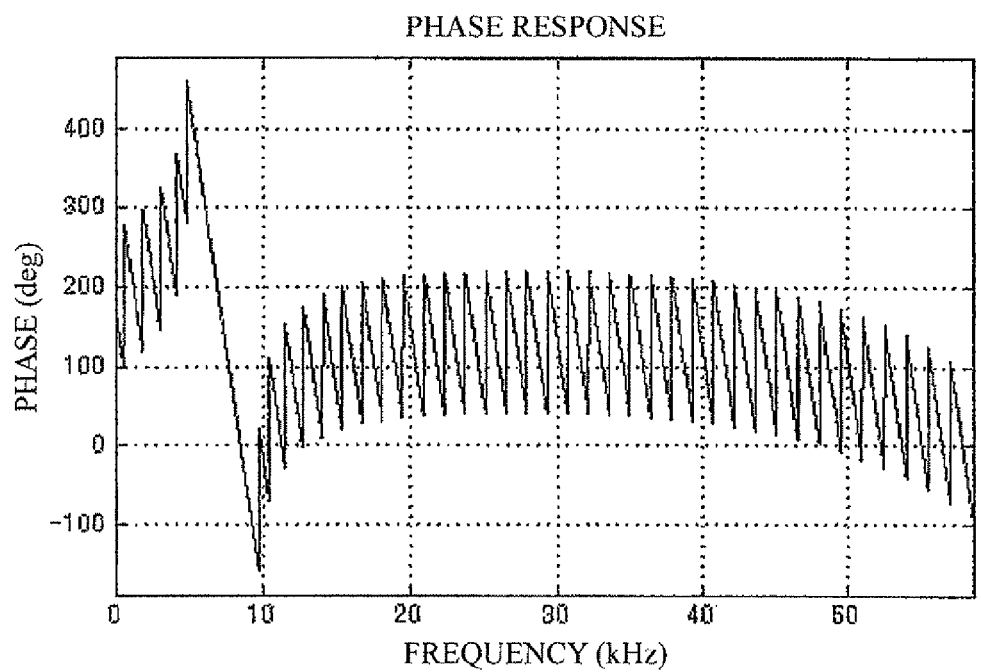
FIG. 4B shows, in relation to the band-pass filter design example, a graph that shows phase response characteristics of the first band-pass filter.

Then, the angle calculator 35, to which the detection angle signal sine value $kA \sin \theta$ and the detection angle signal cosine value $kA \cos \theta$ have been inputted as described above, calculates a detection angle $\theta$ based on an arc tangent arctan, which is obtained from the detection angle signal sine value $kA \sin \theta$ and the detection angle signal cosine value $kA \cos \theta$ (step S16). However, the detection angle $\theta$ calculated by the angle calculator 35 contains a phase shift that has occurred due to each of the first resolver signal S1 and the second resolver signal S2 passing through the respective first band-pass filter 33 or second band-pass filter 43. FIG. 4B is a graph showing phase response characteristics of the first band-pass filter 33. In FIG. 4B, the vertical axis represents phase and the horizontal axis represents frequency. The graph shows a phase shift occurring in the passband of the first band-pass filter 33, which includes an FIR filter. However, since the phase shift is linear with respect to the frequency, accurate phase correction can be readily performed. The difference calculator 37, which has obtained the detection angle $\theta$ outputted from the angle calculator 35, calculates a rotational speed of the rotor based on a difference between multiple obtained samples of the detection angle $\theta$, and outputs the rotational speed as speed data to the phase lag corrector 36 or to the outside (step S17). Upon obtaining the detection angle $\theta$ outputted from the angle calculator 35 and the speed data outputted from the difference calculator 37, the phase lag corrector 36 corrects based on the speed data a phase lag contained in the detection angle $\theta$, which phase lag has occurred due to each of the first resolver signal S1 and the second resolver signal S2 passing through the respective first band-pass filter 33 or second band-pass filter 43. Then, the phase lag corrector 36 outputs the corrected detection angle $\theta$ to the outside as digital angle data (step S18).

The RD converter 1 as described above does not include any feed-back structures, and therefore, shows flat frequency characteristics. Specifically, conventional RD converters including a general tracking loop have frequency dependence since the gain of the loop has frequency characteristics. In contrast, the RD converter 1 according to the present invention does not have such frequency dependence. This makes it possible to reduce a discrepancy between: the digital angle data (detection angle $\theta$) outputted from the RD converter 1, which is obtained from converting the resolver signals at the RD converter 1; and an actual rotation angle of the rotor.

It is desired that among the components of the RD converter 1 having the above configuration, at least the first band-pass filter 33, the second band-pass filter 43, the first sampling synchronous rectifier 34, the second sampling synchronous rectifier 44, and the angle calculator 35 are realized as one or more circuits formed on a single programmable device and/or as one or more programs. The programmable device may further include the sine wave generator 21 and/or the phase corrector 24. For example, an FPGA (Field Programmable Gate Array) may be used as the programmable device. If arithmetic operations by the respective arithmetic sections are processed within a single programmable device, then high-speed arithmetic operations are realized, and also, adjustments among these arithmetic sections can be readily performed. Generally speaking, a conventional RD converter is provided in combination with a resolver to be used with the RD converter. This often makes it difficult for a user to choose, for example, the characteristics and the shape of the RD converter. There are some generally used conventional RD converters that are not provided in combination with any specific resolvers. However, such an RD converter is provided with a number of external components, which makes its settings and adjustments troublesome. In any case, conventional RD converters do not satisfy the current demand for high-density packaging. In contrast, the RD converter 1, which is formed on a single chip as described above, includes a small number of components. Accordingly, the RD converter 1 is compact in size, makes high-density packaging possible, and contributes to cost reduction.

INDUSTRIAL APPLICABILITY

The application of the resolver signal converter and the resolver signal conversion method according to the present invention is not limited to the RD converter 1 described in the above embodiment. The resolver signal converter and the resolver signal conversion method according to the present invention may be widely applied as an arithmetic unit or circuit for converting detection angles contained in resolver signals into digital angle data and outputting the digital angle data. Moreover, the resolver signal converter and the resolver signal conversion method according to the present invention are applicable to a device that is connected to a detector such as a resolver, a Hall element, or an MR element (magnetoresistance element) configured to output two-phase rotation angle position signals and that is configured to convert detection angles contained in such rotation angle position signals into digital angle data and to output the digital angle data.

REFERENCE SIGNS LIST

1 RD converter (resolver signal converter)
2 excitation signal generator
10 resolver
11 excitation coil
12 AC power supply
13 first detection coil
14 voltmeter
15 second detection coil
16 voltmeter
21 sine wave generator
22 DA converter
23 amplifier
24 phase corrector
31 first amplifier
32 first AD converter
33 first band-pass filter 34 first sampling synchronous rectifier
35 angle calculator
36 phase lag corrector
37 difference calculator
41 second amplifier
42 second AD converter
43 second band-pass filter
44 second sampling synchronous rectifier

The invention claimed is:

1. A resolver signal converter comprising:
a first band-pass filter designed to pass, among frequency components of a first resolver signal which is a sine wave output from a resolver, a predetermined bandwidth of which the center frequency is the frequency of an excitation signal;
a first sampling synchronous rectifier configured to sample the first resolver signal which has passed through the first band-pass filter, while synchronizing the first resolver signal with a reference signal which is based on the excitation signal, and to generate a detection angle signal sine value from the sampled first resolver signal;
a second band-pass filter designed to pass, among frequency components of a second resolver signal which is a cosine wave output from the resolver, a predetermined bandwidth of which the center frequency is the frequency of the excitation signal;
a second sampling synchronous rectifier configured to sample the second resolver signal which has passed through the second band-pass filter, while synchronizing the second resolver signal with the reference signal, and to generate a detection angle signal cosine value from the sampled second resolver signal; and
an angle calculator configured to calculate a detection angle from the detection angle signal sine value and the detection angle signal cosine value,
wherein each of the first and second sampling synchronous rectifiers is configured to:
sample the respective first or second resolver signal at a timing when the positive amplitude of the reference signal becomes maximum and at a timing when the negative, amplitude of the reference signal becomes maximum;
either store the sampled resolver signal as it is in a case where the resolver Signal is sampled at the timing when the positive amplitude of the reference signal becomes maximum, and store the sampled resolver signal after inverting the sign of the resolver signal from minus to plus in a case where the resolver signal is sampled at the timing when the negative amplitude of the reference signal becomes maximum, or store the sampled resolver signal as it is in a case where the resolver signal is sampled at the timing when the negative amplitude of the reference signal becomes maximum, and store the sampled resolver signal after inverting the sign, of the resolver signal from plus to minus in a case where the resolver signal is sampled at the timing when the positive amplitude of the reference signal becomes maximum; and
arrange the stored resolver signals in chronological order to generate the respective detection angle signal sine value and detection angle Signal cosine value.

2. The resolver signal converter according to claim 1, further comprising a phase corrector configured to correct the excitation signal by an amount that corresponds to an estimated phase lag, and to supply a resultant signal as the reference signal.

3. The resolver signal converter according to claim 1, further comprising:
a difference calculator configured to calculate a rotational speed based on a difference between samples of the detection angle; and
a phase lag corrector configured to calculate, based on the detection angle and the rotational speed, a corrected detection angle of which a phase lag has been corrected, the phase lag arising due to each of the first and second resolver signals passing through the respective first or second band-pass filter.

4. The resolver signal converter according to claim 1, further comprising: amplifiers, each of which is configured to amplify the respective first or second resolver signal prior to input into the corresponding first or second band-pass filter; and AD converters, each of which is configured to convert the amplified respective first or second resolver signal from an analogue signal into a digital signal and to output the digital signal to the corresponding first or second band-pass filter.

5. The resolver signal converter according to claim 1, wherein at least the first and second band-pass filters, the first and second sampling synchronous rectifiers, and the angle calculator are formed on a single programmable device.

6. A resolver signal conversion method comprising:
a step of filtering a first resolver signal which is a sine wave output from a resolver, by means of a first band-pass filter which is designed to pass, among frequency components of the first resolver signal, a predetermined bandwidth of which the center frequency is the frequency of an excitation signal;
a first sampling synchronous rectifying step of sampling the first resolver signal which has passed through the first band-pass filter, while synchronizing the first resolver signal with a reference signal which is based on the excitation signal, and generating a detection angle signal sine value from the sampled first resolver signal;
a step of filtering a second resolver signal which is a cosine wave output from the resolver, by means of a second band-pass filter which is designed to pass, among frequency components of the second resolver signal, a predetermined bandwidth of which the center frequency is the frequency of the excitation signal;
a second sampling synchronous rectifying step of sampling the second resolver signal which has passed through the second band-pass filter, while synchronizing the second resolver signal with the reference signal, and generating a detection angle signal cosine value from the sampled second resolver signal; and
a step of calculating a detection angle from the detection angle signal sine value and the detection angle signal cosine value, wherein
each of the first and second sampling synchronous rectifying steps includes the steps of:
sampling the respective first or second resolver signal at a timing when the positive amplitude of the reference signal becomes maximum and at a timing when the negative amplitude of the reference signal becomes maximum;
either storing the sampled resolver signal as it is in a case where the resolver signal is sampled at the timing when the positive amplitude of the reference signal becomes maximum, and storing the sampled resolver signal after inverting the sign of the resolver signal from minus to plus in a case where the resolver signal is sampled at the timing when the negative amplitude of the reference, signal becomes maximum, or storing the sampled resolver signal as it is in a case where the resolver signal is sampled at the timing when the negative amplitude of the reference signal becomes maximum, and storing the sampled resolver signal after inverting the sign of the resolver signal from plus to minus in a case where the resolver signal is Sampled at the timing when the positive amplitude of the reference signal becomes maximum; and arranging the stored resolver signals in chronological order to generate the respective detection angle signal sine value and detection angle signal cosine value.

7. The resolver signal conversion method according to claim 6, further comprising the steps of:

calculating a rotational speed based on a difference between samples of the detection angle; and calculating, based on the rotational speed and the detection angle, a corrected detection angle of which a phase lag has been corrected, the phase lag arising due to each of the first and second resolver signals passing through the respective first or second band-pass filter.

* * * * *